United States Patent [19]
Hieda et al.

[11] Patent Number: 5,371,024
[45] Date of Patent: Dec. 6, 1994

[54] SEMICONDUCTOR DEVICE AND PROCESS FOR MANUFACTURING THE SAME

[75] Inventors: Katsuhiko Hieda, Yokohama; Fumio Horiguchi, Tokyo; Hiroshi Takato, Kawasaki; Fujio Masuoka, Yokohama, all of Japan

[73] Assignee: Kabushiki Kaisha Toshiba, Kawasaki, Japan

[21] Appl. No.: 947,907

[22] Filed: Sep. 21, 1992

Related U.S. Application Data

[60] Division of Ser. No. 711,730, Jun. 10, 1991, abandoned, which is a continuation of Ser. No. 413,481, Sep. 27, 1989, abandoned.

[30] Foreign Application Priority Data

Sep. 30, 1988 [JP] Japan ................... 63-243814

[51] Int. Cl.$^5$ .................................. H01L 21/265
[52] U.S. Cl. ................................ 437/40; 437/203; 437/227; 437/913
[58] Field of Search .................... 357/23.3, 59; 287/330–336; 437/40, 203, 228, 913

[56] References Cited

U.S. PATENT DOCUMENTS

| | | | |
|---|---|---|---|
| 4,243,997 | 1/1981 | Natori et al. | 257/330 |
| 4,329,706 | 5/1982 | Crowder et al. | 357/71 |
| 4,329,706 | 5/1982 | Crowder et al. | 357/59 |
| 4,714,951 | 12/1987 | Baudrant et al. | 357/59 |
| 4,945,070 | 7/1990 | Hsu | 357/59 |

FOREIGN PATENT DOCUMENTS

| | | | |
|---|---|---|---|
| 0239250 | 9/1987 | European Pat. Off. | 357/23.3 |
| 2724165 | 12/1977 | Germany . | |
| 3228588 | 2/1983 | Germany . | |
| 2545871 | 3/1983 | Germany . | |
| 3426306 | 4/1985 | Germany . | |
| 52-115663 | 9/1977 | Japan . | |
| 60-229374 | 11/1985 | Japan | 357/23.3 |
| 60-229374 | 11/1985 | Japan | 357/23.3 |
| 61-187273 | 8/1986 | Japan | 357/23.3 |
| 63-044770 | 2/1988 | Japan | 357/23.3 |
| 64-000764 | 1/1989 | Japan | 357/23.3 |
| 1037055 | 2/1989 | Japan | 357/23.3 |
| 64-000765 | 5/1989 | Japan | 357/23.3 |

OTHER PUBLICATIONS

IEEE Transactions on Electron Devices, vol. ED-30, No. 6, Jun. 1983.
Takeda et al. "Submicrometere MOSFET Structure for Minimizing Hot Carrier Generation," IEEE Tran. on Elec. Dev., Apr. 1982, pp. 611–618, 357*23.2.

*Primary Examiner*—Edward Wojciechowicz
*Attorney, Agent, or Firm*—Oblon, Spivak, McClelland, Maier & Neustadt

[57] ABSTRACT

A semiconductor device has a semiconductor substrate of the first conductivity type, a gate electrode buried in a groove formed in an element region of the substrate, first source and drain regions of the second conductivity type formed in surface regions of the semiconductor substrate on either side of the gate electrode, and second source and drain regions each having a concentration higher than that of each of the first source and drain regions, the second source and drain regions being formed in the surface regions of the semiconductor substrate on either side of the gate electrode, spaced away from the gate electrode, and adjacent to the first source and drain regions, respectively. This semiconductor device has a structure wherein the gate electrode is deeply buried in the substrate. Therefore, a short channel effect can be prevented. The gate electrode buried in the groove extends through the semiconductor region, having a low impurity concentration, formed in the surface region of the semiconductor substrate, and hence two low impurity concentration regions are formed. The source and drain regions respectively consist of a low impurity concentration region and a high impurity concentration region adjacent thereto. The low impurity concentration region allows remarkable improvement of a drain breakdown voltage.

22 Claims, 14 Drawing Sheets

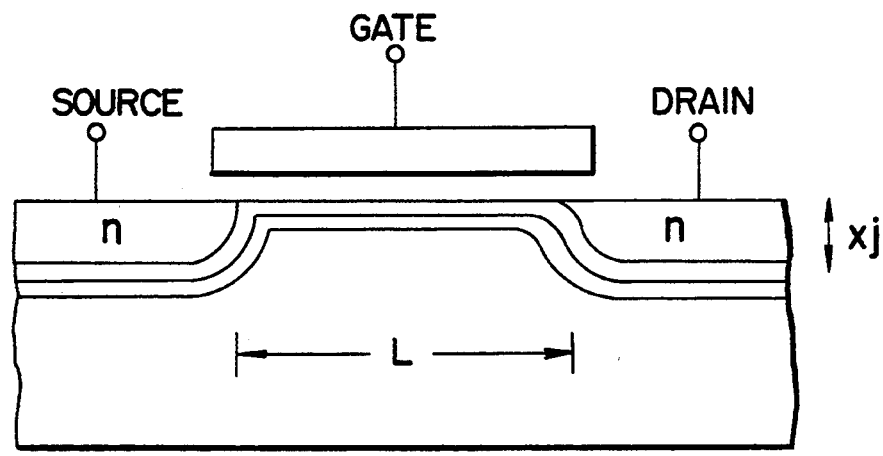
F I G. 1A
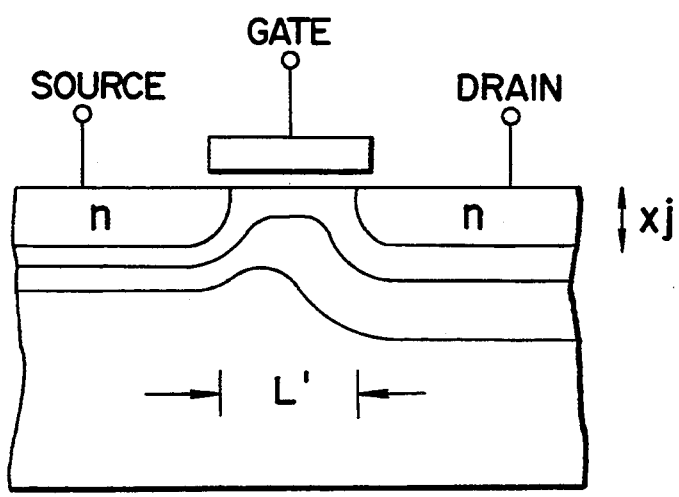
F I G. 1B

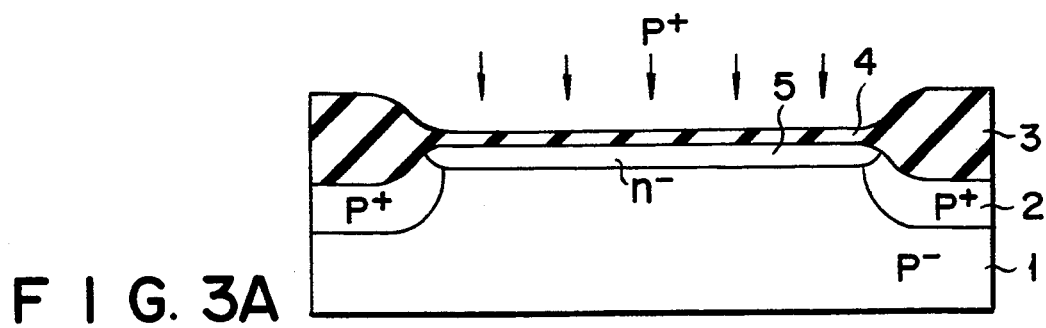
F I G. 3A
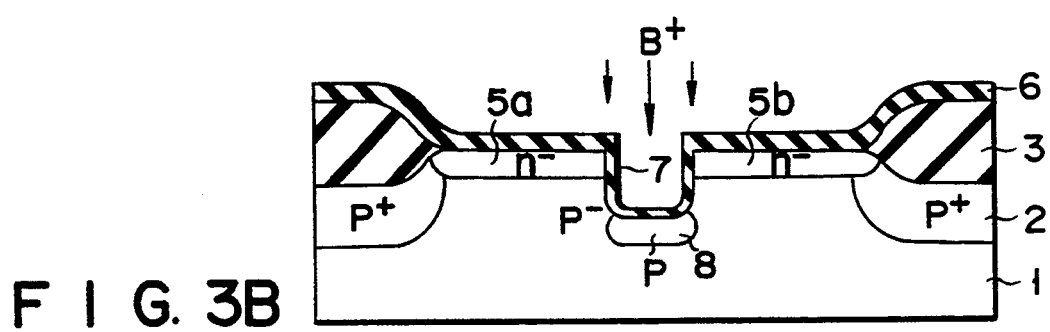
F I G. 3B
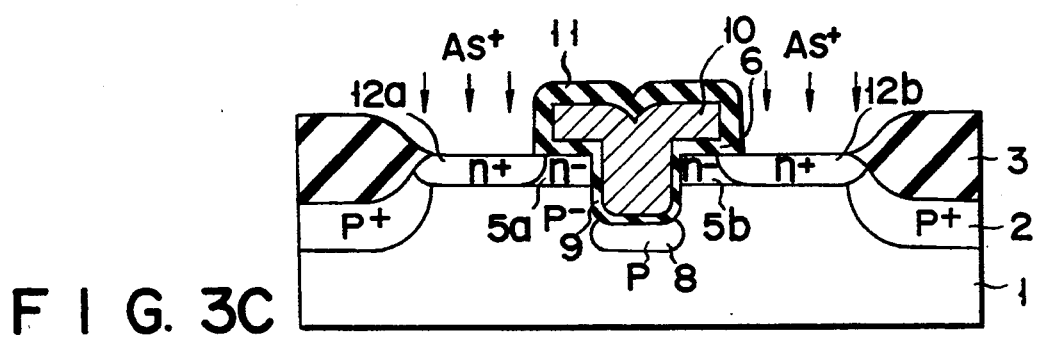
F I G. 3C
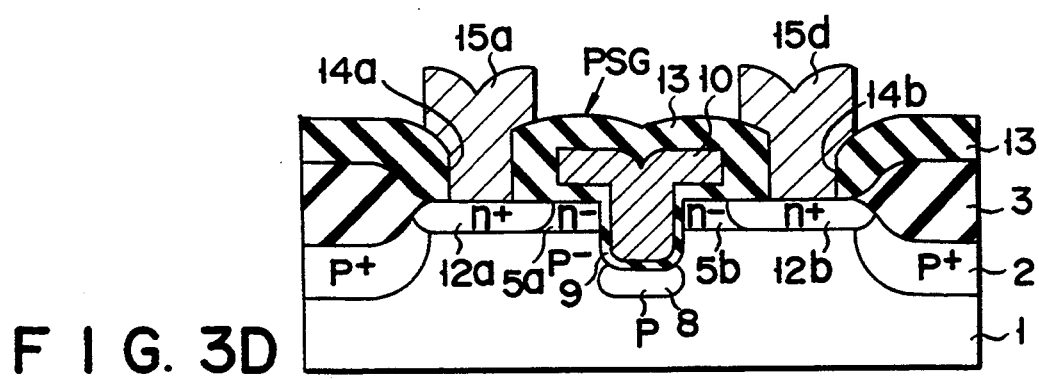
F I G. 3D

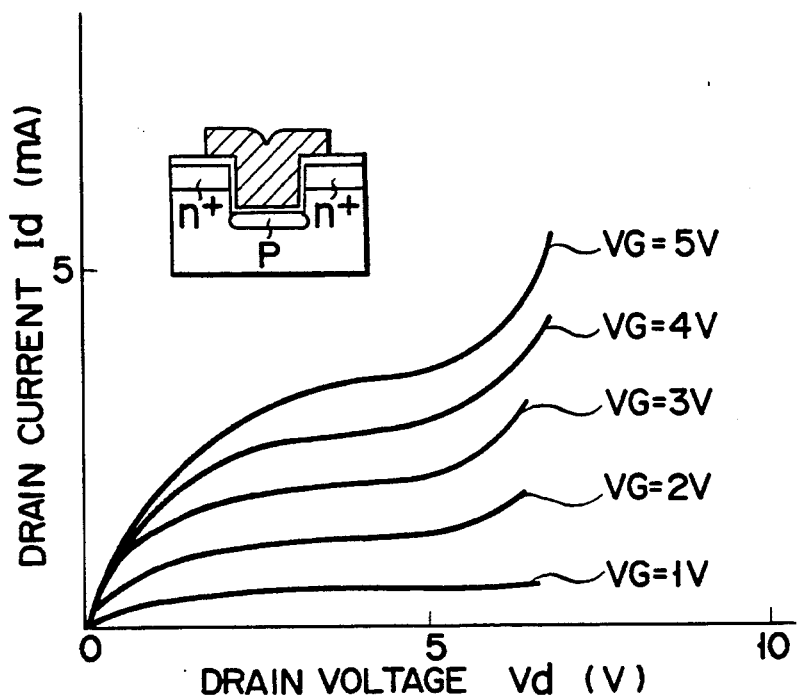
F I G. 4
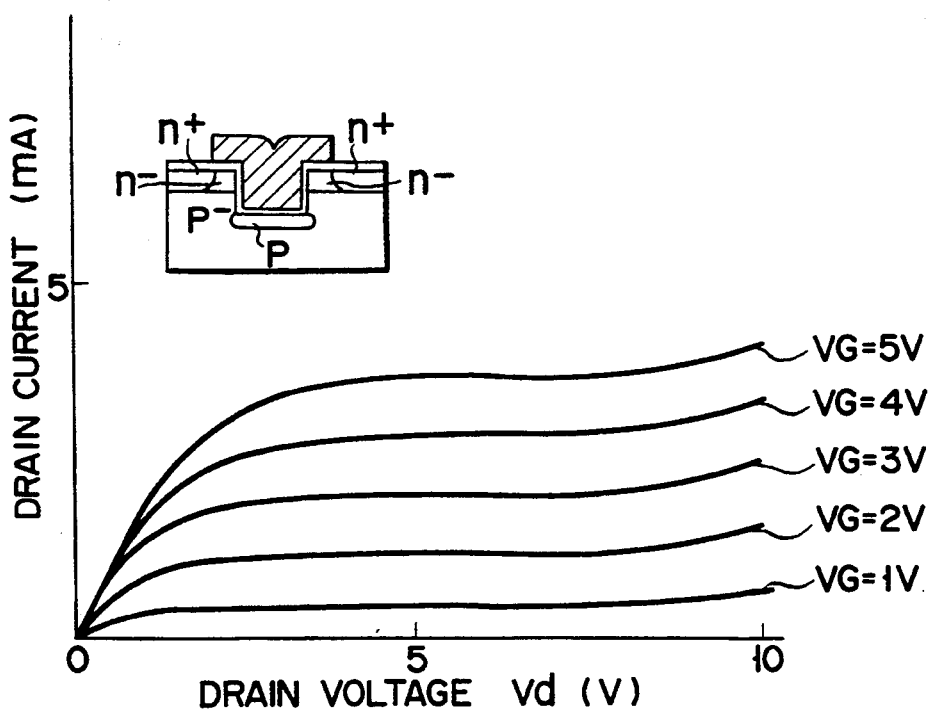
F I G. 5

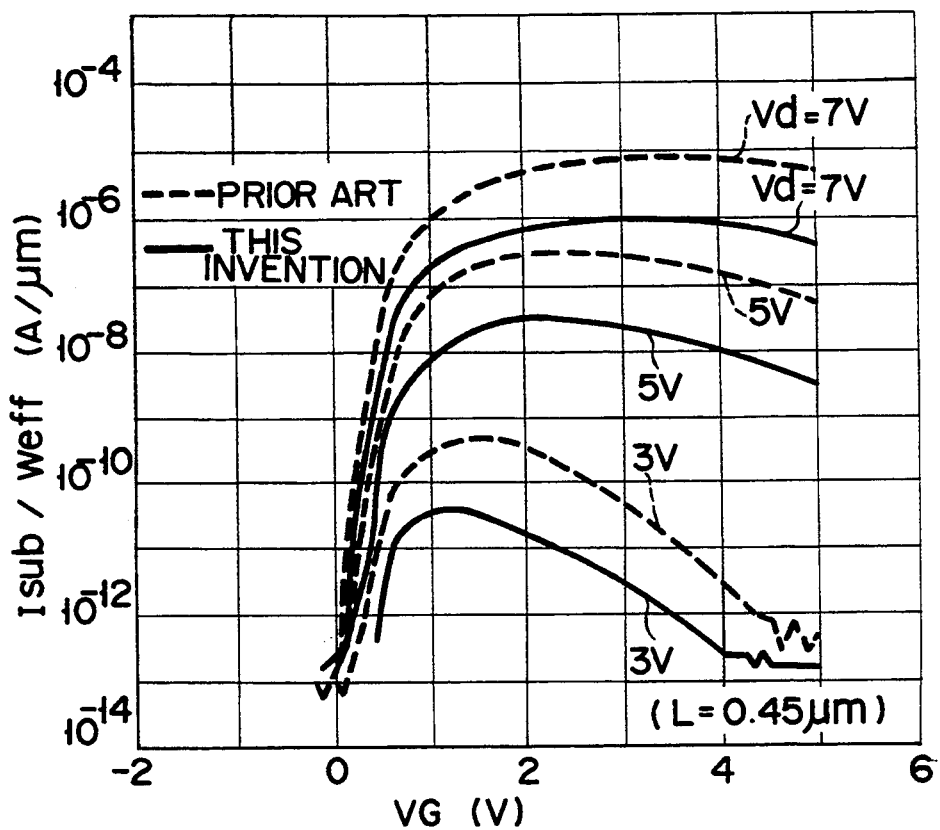
F I G. 6

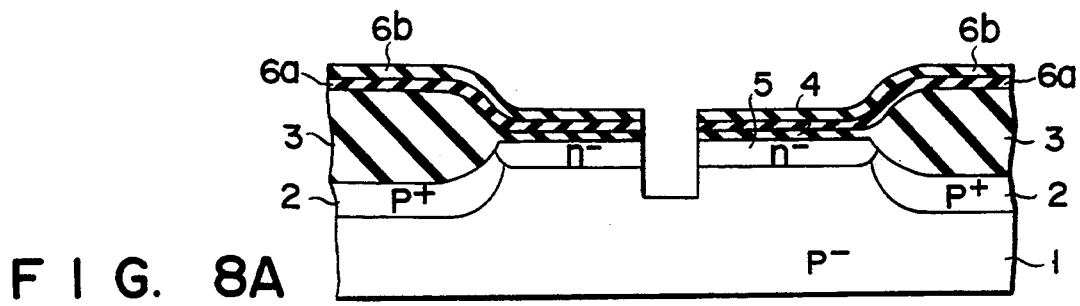
F I G. 8A
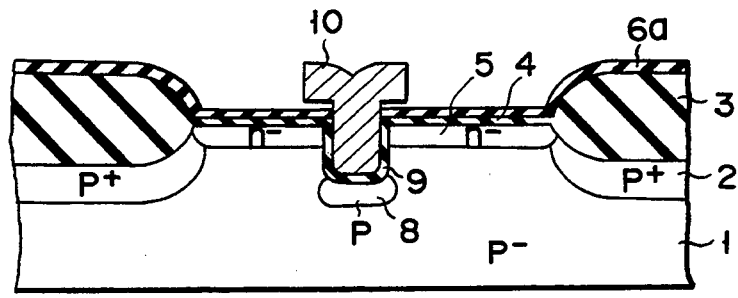
F I G. 8B
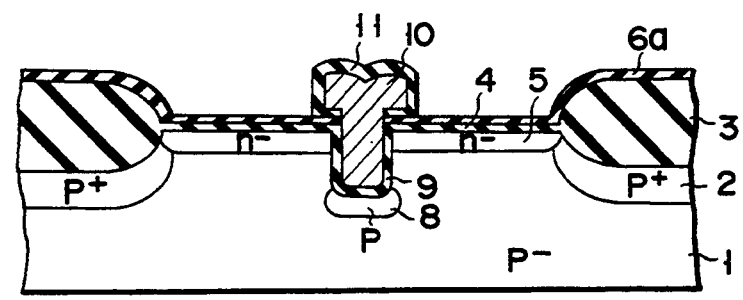
F I G. 8C
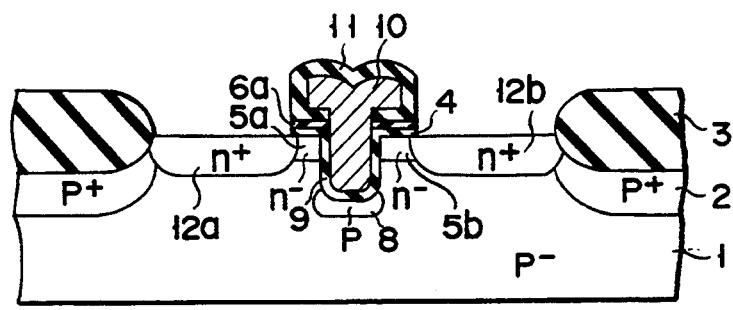
F I G. 8D

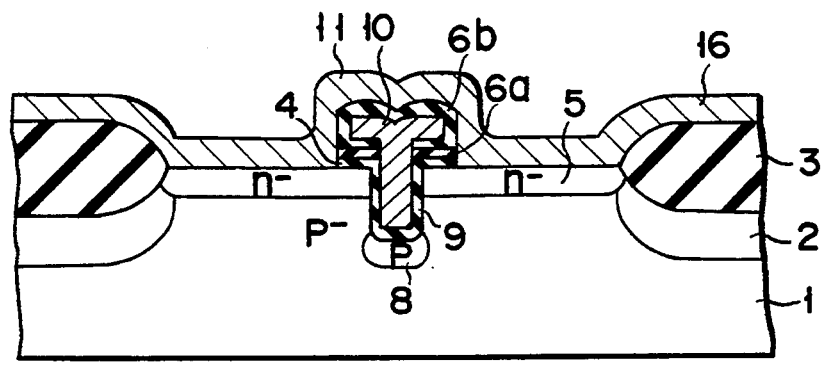
F I G. 9A
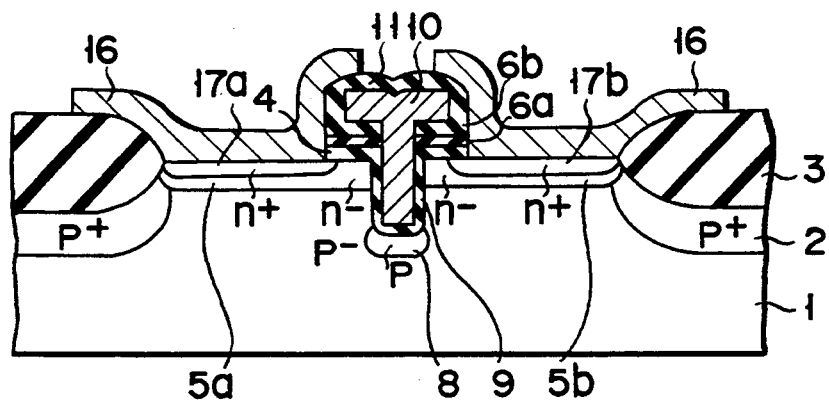
F I G. 9B
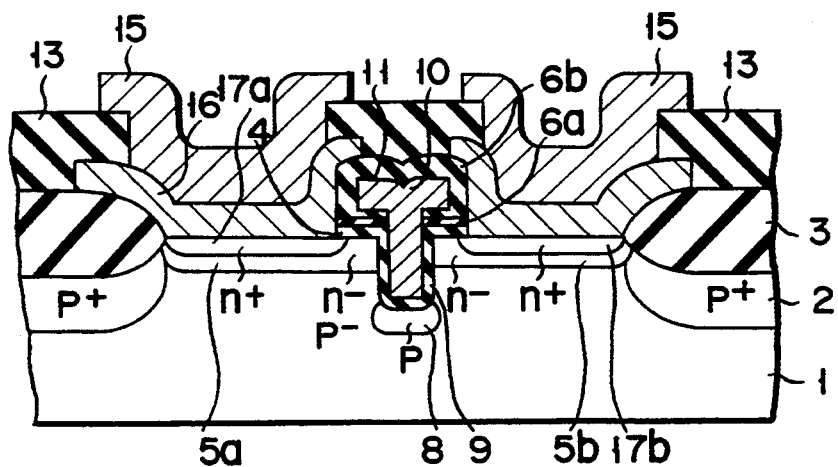
F I G. 9C

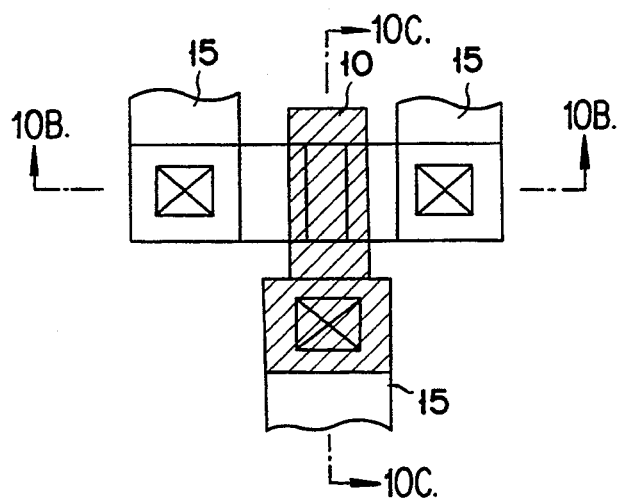
F I G. 10A
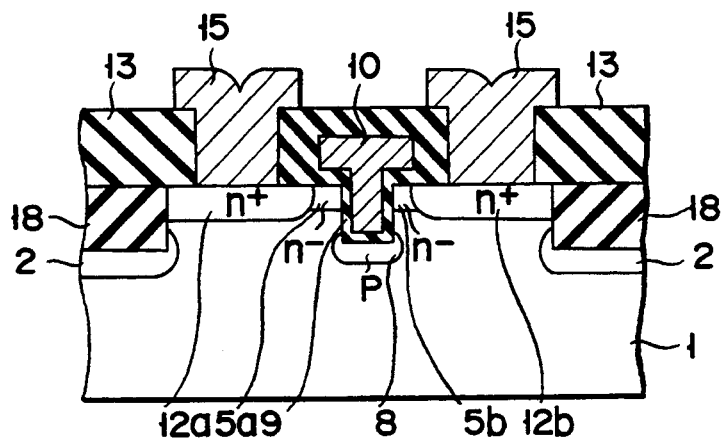
F I G. 10B
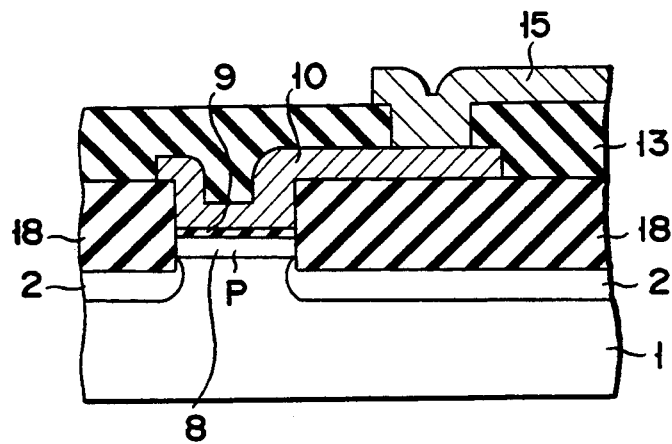
F I G 10C

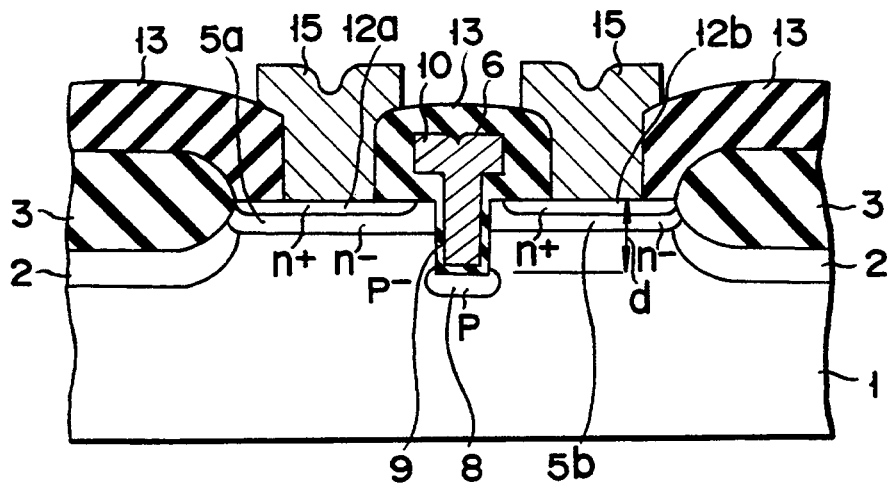
F I G. 11
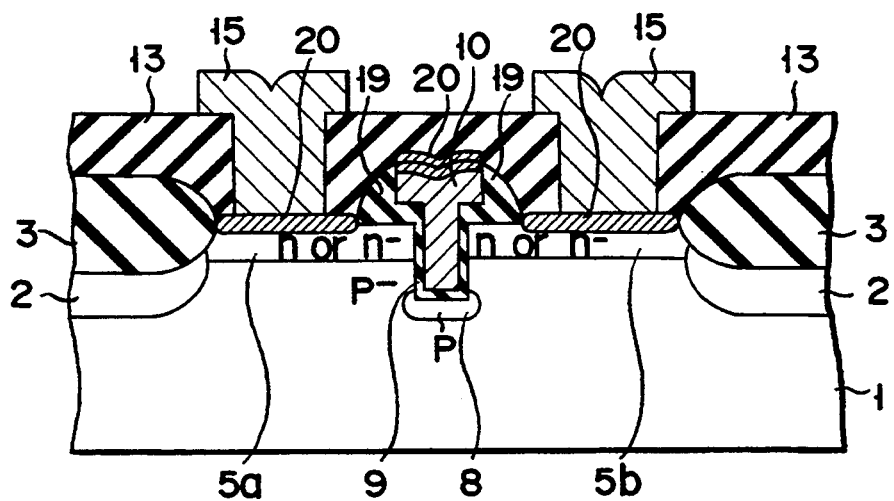
F I G. 12

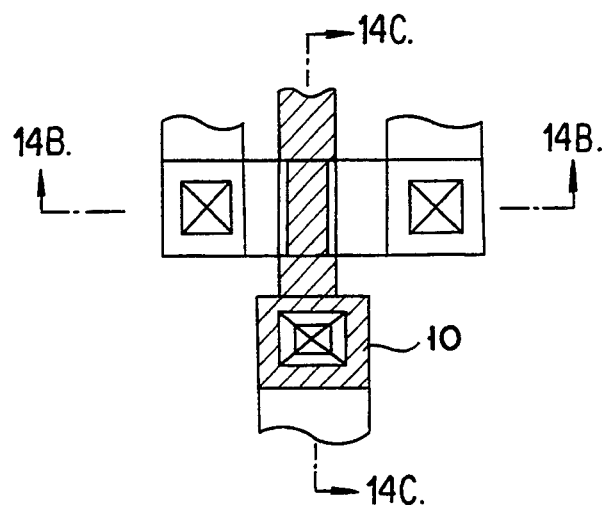
F I G. 14A
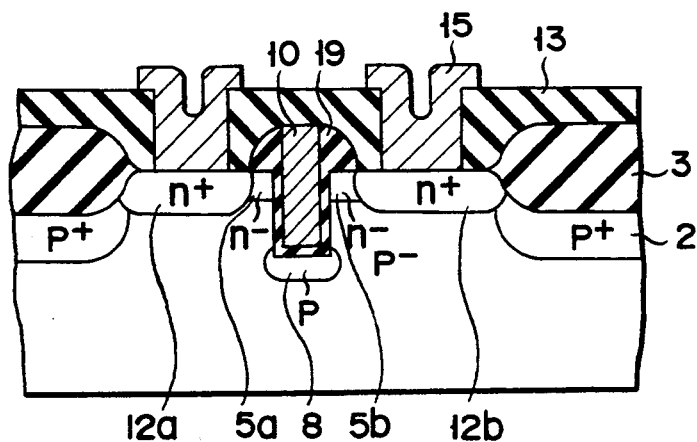
F I G. 14B
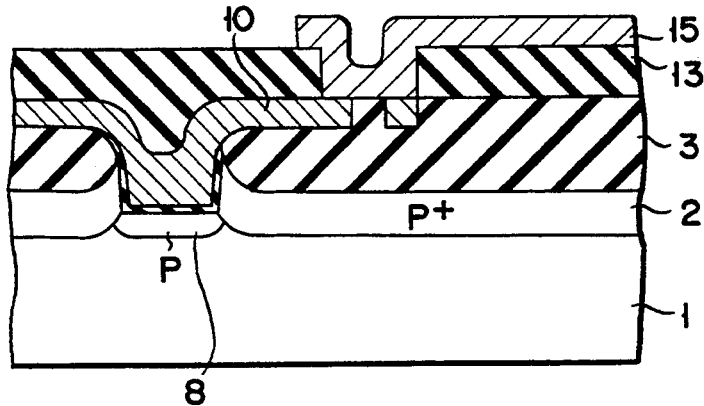
F I G. 14C

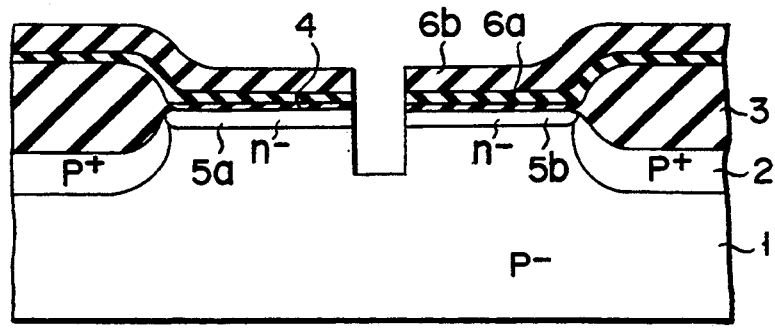
F I G. 15A
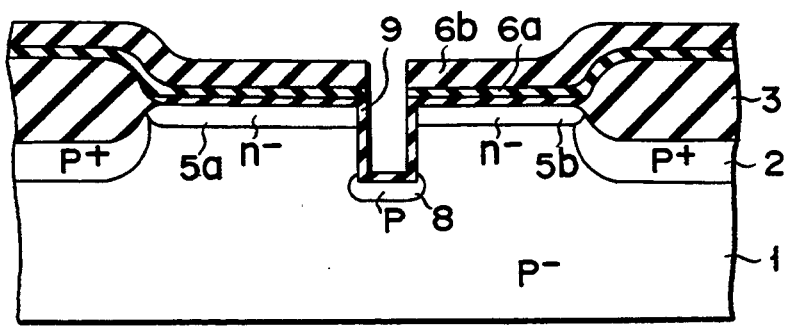
F I G. 15B
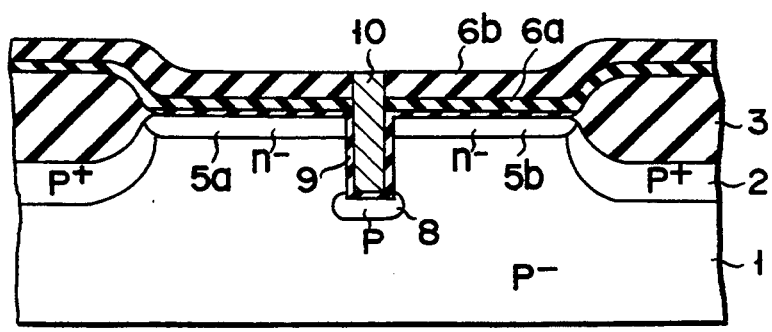
F I G. 15C
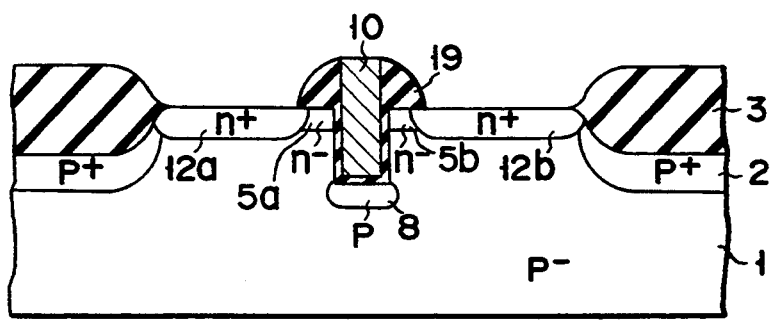
F I G. 15D

SEMICONDUCTOR DEVICE AND PROCESS FOR MANUFACTURING THE SAME

This application is a division of application Ser. No. 07/711,730, filed on Jun. 10, 1991, now abandoned, which was a continuation of application Ser. No. 07/413,481, filed on Sep. 27, 1989, now abandoned.

BACKGROUND OF THE INVENTION

1. Field of the Invention

The present invention relates to a micropatterned MOS semiconductor device and a process for manufacturing the same.

2. Description of the Related Art

A tendency toward a high-integration and high-speed MOSLSI calls for individual MOSFETs to be miniaturized and micropatterned. In other words, when what is known as the channel length between the source and drain regions in a MOSFET is shortened, the integration of the MOSFET is increased, and the capacity of the gate is decreased, thus allowing high-speed operation of the MOSLSI. On the other hand, when the channel length is shortened, the threshold voltage Vth is decreased due to a short channel effect.

For example, in a MOSFET shown in FIGS. 1A and 1B, as shown in FIG. 1A, When the channel length L is sufficiently larger than the diffusion depth Xj of each of the source and drain regions or the width of the depletion layer, equipotential lines in the channel are substantially parallel to each other, and the operation of the elements does not depend on the channel length L or the diffusion depth Xj, and is kept stable. However, when the channel length L is about 2 μm or less, and is substantially equal to the diffusion depth Xj of the source and drain regions and the width of the depletion layer, the equipotential lines in the depletion layer of the channel region are distorted, as shown in FIG. 1B. The distribution of the equipotential lines depends on the diffusion depth Xj of the source and drain regions and the width of the depletion layer.

For this reason, the threshold voltage Vth of the MOSFET is reduced as the channel length L is decreased, and a very small variation in channel length L causes a large variation in threshold voltage Vth. In addition, punch-throughs between the source and drain regions tend to occur depending on the diffusion depth of the source and drain regions or a drain voltage applied to the drain.

In order to eliminate the above disadvantages, it is important to manufacture a MOSFET having a small diffusion depth Xj. However, the diffusion depth Xj cannot be decreased because of a thermal treatment in the manufacturing process of semiconductor devices.

This poses a big problem when a high integration LSI is manufactured.

SUMMARY OF THE INVENTION

It is an object of the present invention to provide a semiconductor device capable of suppressing the influence of s short channel effect, increasing drain breakdown voltage, and performing high-speed operation.

It is another object of the present invention to provide a method of manufacturing the above semiconductor device.

According to the present invention, there is provided a semiconductor device comprising a semiconductor substrate of a first conductivity type, a gate electrode buried in a groove formed in an element region of the substrate, first source and drain regions of a second conductivity type formed in surface regions of the semiconductor substrate, on either side of the gate electrode, and second source and drain regions each having a concentration higher than that of each of the first source and drain regions, the second source and drain regions being formed in the surface regions of the semiconductor substrate on either side of the gate electrode, being spaced apart from the gate electrode, and being formed adjacent to the first source and drain regions, respectively.

According to the present invention, there is provided a semiconductor device comprising a semiconductor substrate of a first conductivity type, a semiconductor region of a second conductivity type formed in a surface region of the semiconductor substrate, a gate electrode which extends through the semiconductor region to enter the semiconductor substrate, the gate electrode dividing the semiconductor region into first source and drain regions, and second source and drain regions each having a concentration higher than that of each of the first source and drain regions, the second source and drain regions being respectively adjacent to the first source and drain regions on the opposite side to the gate electrode, so as to sandwich the first source and drain regions therebetween.

According to the present invention, there is provided a process for manufacturing a semiconductor device, comprising the steps of forming a field insulating film on a semiconductor substrate, forming an impurity region of a second conductivity type in a surface region of the semiconductor substrate isolated by the field insulating film, forming a groove which extends through the impurity region, doping an impurity of a first conductivity type in a bottom portion of the groove, forming a gate electrode by burying a conductive material in the groove, and doping an impurity of the second conductivity type in a region, spaced apart from the gate electrode, of the impurity region to form source and drain regions.

BRIEF DESCRIPTION OF THE DRAWINGS

FIGS. 1A and 1B are views for explaining the problems of a conventional MOSFET;

FIGS. 3A to 3D are sectional views showing the steps in manufacturing the MOSFET shown in FIGS. 2A to 2C;

FIGS. 4 to 7 are graphs showing characteristics of the MOSFET shown in FIGS. 2A to 2C;

FIGS. 8A to 8D are sectional views showing the steps in manufacturing a MOSFET according to another embodiment of the present invention;

FIGS. 9A to 9C are sectional views showing the steps in manufacturing a MOSFET according to yet another embodiment of the present invention;

FIGS. 10A to 10C are sectional views showing a MOSFET according to still another embodiment of the present invention;

FIGS. 11 and 12 are sectional views showing a MOSFET according to a further embodiment of the present invention;

FIGS. 14A to 14C are views showing a MOSFET according to still another embodiment of the present invention;

FIGS. 15A to 15D are sectional views showing the steps in manufacturing a MOSFET according to a further embodiment of the present invention.

DETAILED DESCRIPTION OF THE PREFERRED EMBODIMENTS

In a MOSFET according to the present invention, a gate electrode is buried in a groove formed in a semiconductor substrate. Therefore, a depletion region which extends from the source and drain regions does not enter deep into the channel region, unlike in a conventional MOSFET as shown in FIGS. 1A and 1B. Therefore, even if the diffusion depth Xj of the source and drain regions is increased by thermal treatment in the steps for manufacturing the MOSFET, the influence of a short channel effect, along with a spread of the depletion region which extends from the source and drain regions, can be minimized.

In the MOSFET according to the present invention, a channel doped region is selectively formed only at the bottom portion of the groove for forming the gate electrode, so that the threshold voltage Vth of the MOSFET is effectively determined by the channel doped region, and the current drive capacity is maintained.

In addition, in the MOSFET according to the present invention, the gate electrode buried in the groove extends through a semiconductor region having a low impurity concentration, formed in a surface region of the semiconductor substrate, and two low impurity concentration regions are formed. The source and drain regions respectively consist of the low impurity concentration region and a high impurity concentration region adjacent thereto. The low impurity concentration region of the drain region and the low impurity concentration portion of a channel region allow a remarkable increase of drain breakdown voltage.

Furthermore, in the MOSFET according to the present invention, when the thickness of a gate insulating layer through which the source and drain regions oppose the gate electrode is selectively increased, the gate overlap capacity can be decreased. Therefore, a high speed operation can be performed.

Various preferred embodiments of the present invention will be described hereinafter with reference to the accompanying drawings.

Figure 2A:
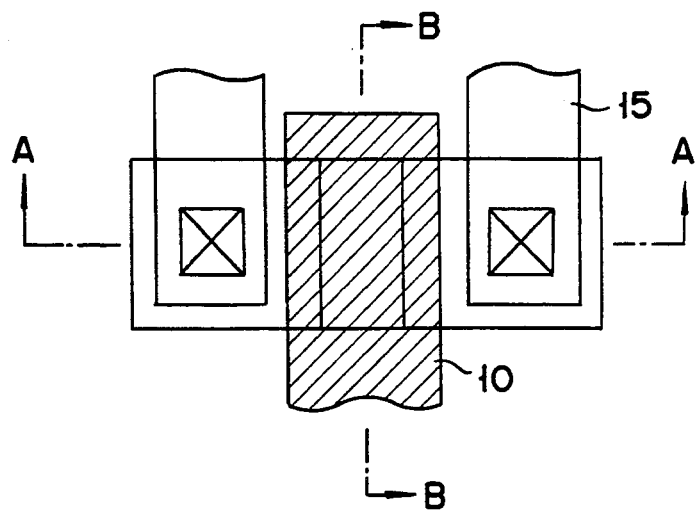
FIGS. 2A to 2C are views showing a MOSFET according to one embodiment of the present invention.
Figure 2B:
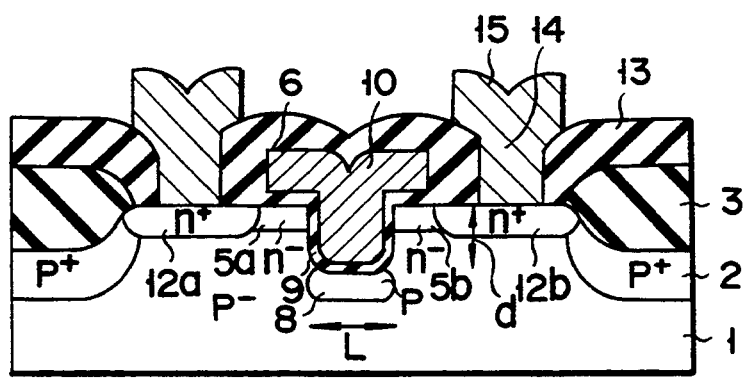
Figure 2C:
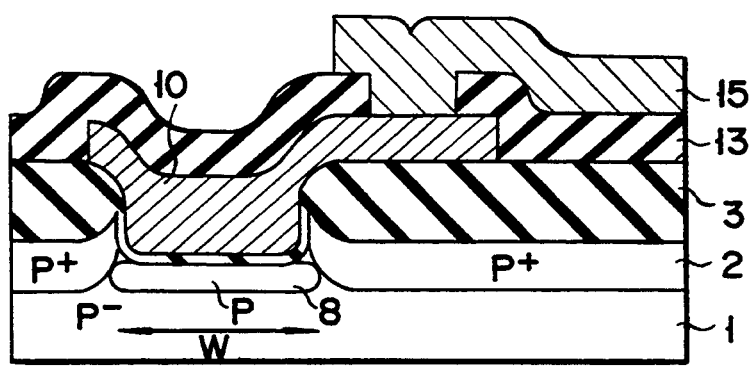

FIGS. 2A, 2B, and 2C are a plan view of a MOSFET according to an embodiment of the present invention, a sectional view thereof taken along the line A—A, and a sectional view thereof taken along the line B—B, respectively. N$^-$-type regions 5a and 5b each having an impurity concentration of $5 \times 10^{18}$ atoms/cm$^3$ and a diffusion depth of 0.2 $\mu$m are formed in a MOSFET region, formed in a p$^-$-type Si substrate 1 having an impurity concentration of $1 \times 10^{16}$ atoms/cm$^3$, and isolated by an element isolation insulating film 3. A groove having a depth d (=0.5 $\mu$m) is formed in the regions 5a and 5b. The p$^-$-type Si substrate may be a semiconductor wafer or a p$^-$-type well obtained by doping a p-type impurity in the wafer.

A channel ion-implanted layer 8, serving as a p-type impurity layer having an impurity concentration of $5 \times 10^{16}$ atoms/cm$^3$, is formed in the bottom region of the groove, and is spaced apart from the n$^-$-type regions 5a and 5b. The threshold voltage Vth is controlled by the channel ion-implanted layer 8.

A gate insulating film 9 is formed over the inner surface of the groove and a part of the upper surface of the substrate. A gate electrode 10 consisting of poly-Si in which phosphorus is doped is formed on the insulating film 9 so as to bury the groove and to cover the n$^-$-type regions 5a and 5b. At this time, the thickness of the insulating film on the upper surface of the substrate is set to be larger than that of the gate insulating film of the channel portion. For example, the thickness of the insulating film on the inner surface of the groove is 20 nm, and that of the insulating film on the upper surface of the substrate is 200 nm.

N$^+$-type regions 12a and 12b each having an n-type impurity concentration of $5 \times 10^{20}$ atoms/cm$^3$ and a diffusion depth of 0.25 $\mu$m, are self-aligned using the gate electrode 10 as a mask. The impurity concentration of each of the n$^+$-type regions 12a and 12b is higher than that of each of the n$^-$-type regions 5a and 5b. A width L of the groove in the channel direction is 0.45 $\mu$m. A source region consists of the n$^-$- and n$^+$-type regions 5a and 12a, and a drain region consists of the n$^-$- and n$^+$-type regions 5b and 12b.

A MOSFET of a grooved gate type having an LDD structure is constituted thus.

The steps in manufacturing the above-described MOSFET will be described hereinafter with reference to FIGS. 3A to 3D.

In FIG. 3A, an oxide film (not shown) having a thickness of, e.g., about 50 nm is formed on the p$^-$-type Si substrate 1 having an impurity concentration of about $1 \times 10^{16}$ atoms/cm$^3$, then an Si$_3$N$_4$ film (also not shown) is patterned, and ion implantation of boron serving as a channel stopper impurity is performed at an accelerated energy of, e.g., 80 KeV and a dose of $2 \times 10^{13}$ ions/cm$^2$ using the patterned Si$_3$N$_4$ film as a mask. Thermal oxidation is then performed in an atmosphere of a gas mixture of O$_2$ and H$_2$O at, e.g., 1,000° C. by a selective oxidation method, to form an SiO$_2$ film having a thickness of about 700 nm as the element isolation insulating film 3.

Upon this oxidation process, the channel stopper impurity is diffused under the element isolation insulating film and in a lateral direction to form a region 2. Although the above element isolation formation method is exemplified in this case, another element isolation method may be employed. Thereafter, an Si substrate region isolated by the element isolation insulating film 3 is exposed, and another thermal oxide film 4 having a thickness of about 20 nm is formed. Thereafter, using the thick element isolation insulating film 3 as a mask, e.g., phosphorus (P+) ions are implanted in the entire surface at an accelerated voltage of about 100 KeV and a dose of about $4 \times 10^{13}$ ions/cm$^2$ to form an n$^-$-type diffusion layer 5.

As shown in FIG. 3B, a CVD SiO$_2$ film 6 having a thickness of about 200 nm is deposited on the entire surface. Using a resist pattern obtained by patterning a resist (not shown) by photolithography as a mask, the CVD SiO$_2$ film 6 is etched by reactive ion etching (RIE). Then, a groove is formed in the Si substrate by RIE using a chlorine- or fluorine-based gas. The resist may be removed before the Si etching, or after the groove is formed. The n$^-$-type region 5 is divided into the n$^-$-type regions 5a and 5b by this groove.

Since the CVD $SiO_2$ film 6 is used only as a mask material for forming the groove, a CVD $Si_3N_4$ film or a composite film therewith may be used in place of the CVD $SiO_2$ film.

Then, after a damage layer formed by RIE on the inner wall of the groove is removed by, e.g., oxidation in a dry $O_2$ atmosphere and etching using an $NH_4F$ solution, a thermal oxide film 7 is formed on the inner surface of the groove. Thereafter, e.g., boron ($B^+$) ions are implanted at an accelerated voltage of about 10 KeV and a dose of about $5 \times 10^{11}$ ions/cm² to selectively form the p-type channel impurity layer 8 only at the bottom portion of the groove. By controlling the thickness of the thermal oxide film 7, selective formation of the p-type layer at the bottom portion of the groove can be controlled. In order to prevent channeling, ion implantation is performed while the substrate is slightly inclined. However, a vertical ion implantation method can also be employed.

As shown in FIG. 3C, after the thermal oxide film 7 on the inner surface of the groove is removed, a thermal oxide film 9 having a thickness of about 20 nm is formed. A poly-Si film in which, e.g., phosphorus is doped is deposited on the entire surface including the groove through the thermal oxide film 9. The poly-Si film is patterned to form the gate electrode 10. Thereafter, for example, thermal oxidation is performed in an $O_2/H_2O$ atmosphere at 850° C., and hence a thick oxide film 11 having a thickness of about 150 nm is formed on the surface of the poly-Si gate electrode 10. This oxide film 11 improves the ion-implantation mask performance of the poly-Si gate electrode.

Then, Si substrate surface portions of the source and drain regions are etched and exposed using, e.g., an $NH_4F$ solution. Thereafter, e.g., arsenic ($As^+$) is ion-implanted at an accelerated voltage of 50 KeV and a dose of about $5 \times 10^{15}$ ions/cm² to form the $n^+$-type impurity diffusion layers 12a and 12b. Thus, a source region consisting of the $n^-$ and $n^+$-type regions 5a and 12a, and a drain region consisting of the $n^-$ and $n^+$-type regions 5b and 12b are formed.

As shown in FIG. 3D, an interlayer insulating CVD $SiO_2$/BPSG film having a thickness of about 600 nm is deposited on the entire surface, and a BPSG melt process is performed at 900° C. for 80 minutes to flatten the entire surface. Thereafter, contract holes 14a and 14b to the source and drain are formed, and Al is deposited on the entire surface. The Al layer is patterned by photolithography and RIE to form source and drain electrodes 15a and 15b. Thus, formation of the basic structure of the MOSFET is completed.

According to the structure of this embodiment, a depth d of the groove is set to be larger than a diffusion depth Xj of the source region 5a or 12a, and the drain region 5b or 12b. In addition, the positions of the source region 5a or 12a, and the drain region 5b or 12b are higher than that of the channel impurity region 8. Therefore, a short channel effect can be improved.

Since the p-type region 8 is selectively formed at the bottom surface of the groove, the threshold voltage Vth is determined by this region, and the channel region on the side surface of the groove does not contribute to the determination of the threshold voltage Vth. In other words, the threshold voltage of the bottom portion of the groove is higher than that of the $p^-$-type region on the side surface of the groove. For this reason, a resistance of the channel region on the side surface of the groove is small during operation, hence a larger drive capacity can be obtained by the $p^-$-region on the side walls of the groove while a short channel effect is prevented.

The types of impurity concentration of the regions from the source and drain regions to the channel region at the bottom of the groove are changed as follows. That is, the $n^+$-type impurity layers 12a and 12b, the $n^-$-type impurity layers 5a and 5b, the p-type impurity region (wafer or well), and the p-type impurity layer 8 (channel region), are changed in the order named. Since the $n^-$-type impurity layers 5a and 5b, between which the groove extends, are formed, the drain breakdown voltage is remarkably increased.

FIGS. 4 and 5 are graphs showing measurement values of a drain voltage Vd and a drain current Id when the gate voltage is set to be 1 to 5 V. FIG. 4 shows a comparative example when the $n^-$-type impurity layers 5a and 5b are not formed, and FIG. 5 shows this embodiment when the $n^-$-type impurity layers 5a and 5b are formed. The channel width W/channel length L (width of groove)=10 $\mu$m/0.45 $\mu$m, and the substrate voltage Vsub=0 V. Although the drain breakdown voltage in the comparative example only slightly exceeds 7 V, the drain breakdown voltage in this embodiment is 10 V or more. This difference indicates that even if a power source of 5 V is used and the drain voltage of the internal circuit is bootstrapped up to about 8 V, a normal operation can be performed.

FIG. 6 shows a relationship between a gate voltage $V_G$ and a substrate current (Isub/Weff(L)) with respect to various drain voltages Vd. The substrate current is as small as about one-ten of that in the comparative example. This means that the number of electron-hole pairs generated by impact-ionization in the drain is small. It is assumed from this result that the MOSFET of this embodiment has high reliability as compared with that in the comparative example.

Figure 7:
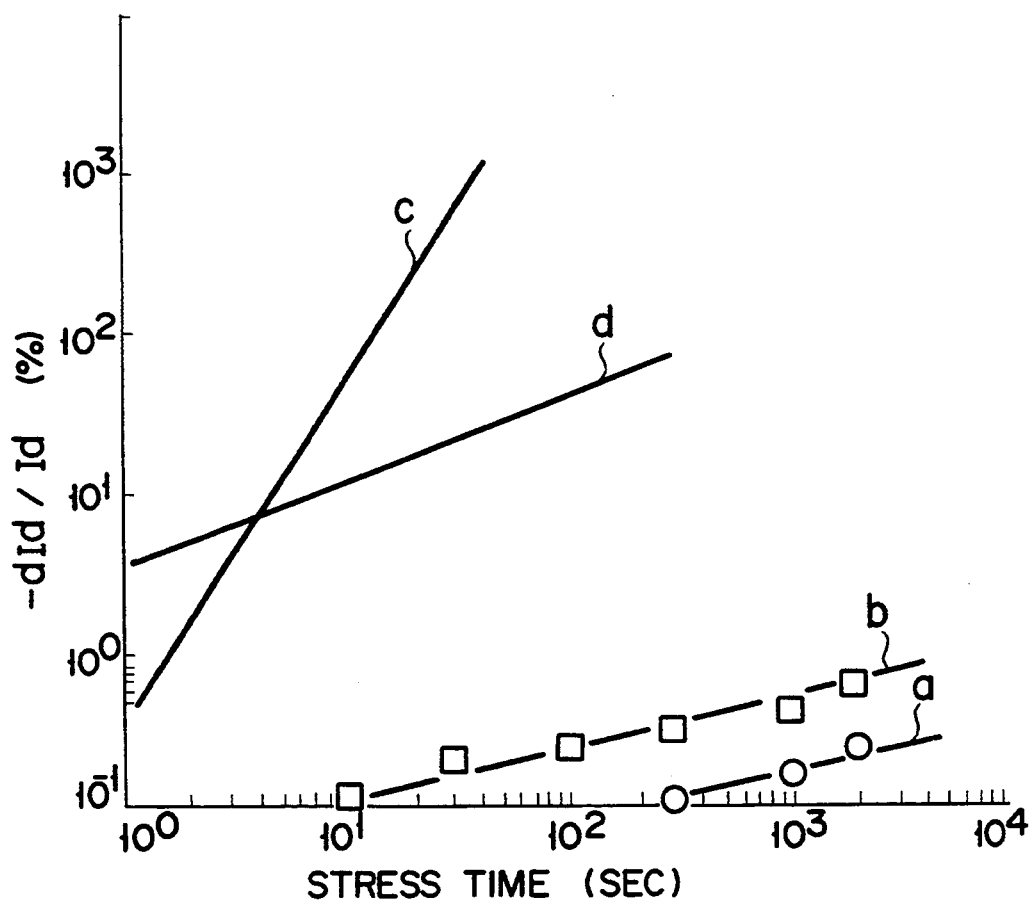

FIG. 7 shows relationship between a stress time and a decrease in drain current Id.

In FIG. 7, curve a represents characteristics of the MOSFET according to the present invention; curve b, characteristics of the MOSFET of a grooved gate type without an $n^-$-type region; curve c, characteristics of the MOSFET of a flat type having an LDD structure; and curve d, characteristics of a normal MOSFET. In this graph, a gate electrode voltage set at a peak condition of the substrate current Isub is used. At this time, the decrease in drain current Id is most remarkable. As is understood from FIG. 7, the decrease value $-dId/Id$ of the drain current of the MOSFET according to the present invention is improved as compared with the other MOSFETs. In particular, it is understood that the MOSFET of this invention is further improved as compared with the flat-type MOSFET.

The structure shown in FIGS. 2A to 2C has some other features. One feature is that this structure is resistant to punch-throughs between the source and the drain because of a grooved gate type structure. In the flat-type MOSFET, a high-concentration layer is often formed under the channel to suppress a punch-through. On the other hand, formation of the high-concentration region tends to cause a substrate bias effect wherein a threshold voltage is changed with respect to the substrate bias. Since this structure is originally resistant to punch-throughs, a very high concentration of the substrate is not required, and the substrate bias effect does not easily occur.

As shown in FIG. 2C, since an extention of the channel stopper impurity layer 2 in a lateral direction toward the channel is stopped by formation of the groove, this structure is resistant to a short channel effect. This impurity layer 2 prevents a parasitic channel forming on the side surface of the groove.

One feature of this structure is that, since the groove extends between the n⁻-type regions 5a and 5b, the impurity regions 5a and 5b can be formed without an alignment mask. Another feature of this structure is that the n+-type impurity layers 12a and 12b can be formed in self-alignment with the gate electrode 10.

In addition, the thickness of the gate insulating film between the gate electrode and the source and drain regions formed on the substrate surface is selectively increased, and the overlap capacity between the gate and the source and drain regions is decreased, thus further increasing the operation speed of the element.

The concentration of the n+-type impurity layer 12 is preferably $1 \times 10^{20}$ atoms/cm³ or more, and that of the n⁻-type impurity layer 5 preferably falls within the range of $5 \times 10^{18}$ to $1 \times 10^{19}$ atoms/cm³.

FIGS. 8A to 8D show the steps in manufacturing a MOSFET according to another embodiment of the present invention. Although a CVD SiO₂ layer is used as an etching mask to form a groove in the embodiment shown in FIGS. 3A to 3D, a two-layer structure consisting of a CVD Si₃N₄ layer 6a and a CVD SiO₂ layer 6b is used as an etching mask in this embodiment, as shown in FIG. 8A. Therefore, as shown in FIG. 8A, the CVD SiO₂ film 6b can be used to etch an Si substrate in the same manner as in FIG. 3A. As shown in FIG. 8B, after a gate electrode 10 is formed, the CVD SiO₂ film 6b can be easily and selectively removed using, e.g., an NH₄F solution. As shown in FIG. 8C, for example, when oxidation is performed in an O₂/H₂O atmosphere at 850° C. for about 10 minutes, an SiO₂ film 11 can be selectively formed on only the surface of the poly-Si gate electrode 10. As shown in FIG. 8D, the CVD Si₃N₄ film 6a is selectively removed from the surface of the source and drain regions by hot phosphoric acid using the SiO₂ film 11 as a mask. Then, an SiO₂ film 4 on the source and drain regions is removed by a diluted hydrofluoric acid to expose the source and drain regions. According to the method shown in FIGS. 8A to 8D, an undesirable decrease in thickness of an element isolation insulating film 3 can be minimized without a variation when the source and drain regions are exposed. In addition, since the insulating film between the gate and the source and drain regions can consist of the multi-layered film of the SiO₂ film 4, the CVD Si₃N₄ film 6a, and the CVD SiO₂ film 6b, its thickness can be increased, thus decreasing an overlap capacity between the gate and the source and drain regions.

FIGS. 9A to 9C show the steps in manufacturing a MOSFET according to still another embodiment of the present invention. In the embodiment shown in FIGS. 3A to 3D, source and drain electrodes 15a and 15b are formed by patterning an aluminum layer. In this method, however, a margin for mask alignment between a gate electrode 10 and the contact thereof is required, and hence it is difficult to increase an integration degree. On the contrary, in the embodiment shown in FIGS. 9A to 9C, after the step in FIG. 8C, the source and drain regions are selectively exposed, as shown in FIG. 9A. Poly-Si having a thickness of, e.g., about 100 nm to 400 nm is deposited on the entire surface by CVD, and phosphorus is doped by diffusion at 900° C. for 60 minutes. The doping in a poly-Si film 16 may be performed by ion implantation of arsenic or phosphorus. In order to implant ions in a region near the interface between the poly-Si film and the source and drain regions, a two-step deposition and doping method may be used, i.e., a layer having a thickness of about 100 nm is deposited first, ions are implanted, and a layer of the remaining thickness is deposited. As shown in FIG. 9B, annealing is performed at 900° C. for about 30 minutes to diffuse an impurity from the poly-Si film 16, thus forming the n+-type diffusion layer 17a, 17b in the source and drain regions.

Note that the thickness of the n+-type diffusion layer 17 may or may not exceed the diffusion depth Xj of the n⁻-type diffusion layer 5. In addition, a pad electrode 16 is formed by normal photolithography and RIE.

As shown in FIG. 9C, an insulating interlayer 13 is deposited in the same manner as in FIG. 3D. After the interlayer 13 is flattened in the same manner as in FIG. 3D, a contact hole and a wiring layer 15 are formed, thus completing the MOSFET.

when this method is employed, (1) since the pad electrode is self-aligned with the gate electrode, and can be formed above the gate electrode 10, an increase in area caused by extension of the gate electrode 10 to the outside of the groove can be prevented.

More specifically, contact can be achieved on the pad electrode 16 formed on the gate electrode 10, hence micropatterning can be realized. In addition, (2) since the pad electrode 16 can extend on the gate electrode 10 or the element isolation insulating film 3, a contact hole can be formed on the element isolation insulating film 3. Therefore, a larger contact hole can be formed in the same element area, and contact resistance can be reduced, thus increasing the drive current for the element.

An embodiment shown in FIGS. 10A to 10C will be described hereinafter. In the embodiment shown in FIGS. 2A to 2C, a field insulating film formed by selective oxidation is used as an element isolation insulating film. However, the element isolation method need not be limited thereto. According to the embodiment shown in FIGS. 10A to 10C, a trench-type element isolation method is used in which a groove having a thickness of about e.g., 0.7 μm is formed in an Si substrate, and a deposited insulating film 18 for an element isolation is buried in this groove. An SiO₂ film, a non-doped poly-Si film, or a multi-layered film obtained by combining them can be used as an element isolation insulating film. When these element isolation methods are employed, a layer formed on the substrate can be easily processed because the element isolation structure is flat. When a groove of the MOSFET is also formed on the element isolation film, and a gate electrode 10 is entirely or partially buried in the element isolation film, flatness and processability are further improved. In addition, since the side surface of the groove of the MOSFET can be isolated by the element isolation insulating film 18 in width direction of the channel (FIG. 10C) of the MOSFET, a parasitic channel which has been conventionally suppressed by only a p+-type channel stopper layer 2 can be perfectly suppressed, thus remarkably improving the reliability of the element.

An embodiment shown in FIG. 11 will be described hereinafter. N+-type regions 5a and 5b, and n⁻-type regions 12a and 12b are formed in a surface region of a substrate 1, and are adjacent to each other in the embodiment shown in FIGS. 2A to 2C. In the embodiment shown in FIG. 11, however, the diffusion depths of the n+-type regions 12a and 12b are decreased, and hence the entire lower surfaces of the n+-type regions 12a and 12b are covered with the n−-type regions 5a and 5b. Therefore, a junction having a smaller depth can be realized, and the characteristics of the device are not adversely affected by the depth d of the groove.

The embodiment shown in FIG. 12 will be described below. In the embodiment shown in FIGS. 2A to 2C, the source and drain regions consist of impurity regions having different concentrations, i.e., the n− and n+-type regions. In the embodiment shown in FIG. 12, however, the source and drain regions consist of only the n- or n−-regions 5a and 5b. In order to reduce the contact resistance of the n- or n−-regions 5a and 5b and an interconnection layer 15, a conductive layer 20 consisting of titanium silicide, molybdenum silicide, or tungsten silicide may be formed on the surfaces of the regions 5a and 5b. The conductive layer 20 may be formed on the upper surface of the gate electrode. The step of forming the conductive layer 20 can be performed in the step shown in FIG. 3C. More specifically, after the source and drain regions are selectively exposed, a refractory metal such as titanium, tungsten, or molybdenum is deposited. This metal is thermally alloyed with substrate silicon to form a silicide, and a non-alloyed metal is removed by etching, thus forming the conductive layer 20. In FIG. 12, after a gate electrode 10 is patterned, an insulating film 19 is left on the side wall of the gate electrode 10 using a side wall leaving process. This process employs a normal method comprising subjecting the entire surface of a CVD SiO₂ film to RIE, thus leaving a CVD SiO₂ film 19 on the side wall of the gate electrode 10. Titanium silicide or tungsten silicide is formed using the above-mentioned method. Note that, e.g., a tungsten layer may be formed by selective CVD in place of a silicide formed by thermal alloying.

Figure 13A:
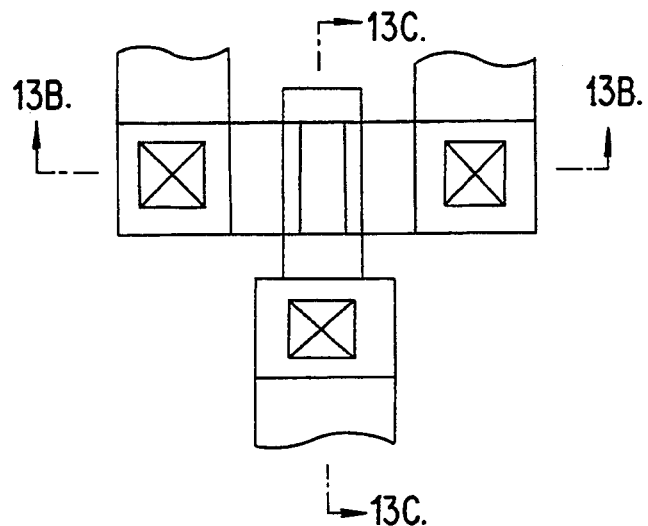
FIGS. 13A to 13C are views showing a MOSFET according to yet another embodiment of the present invention.
Figure 13B:
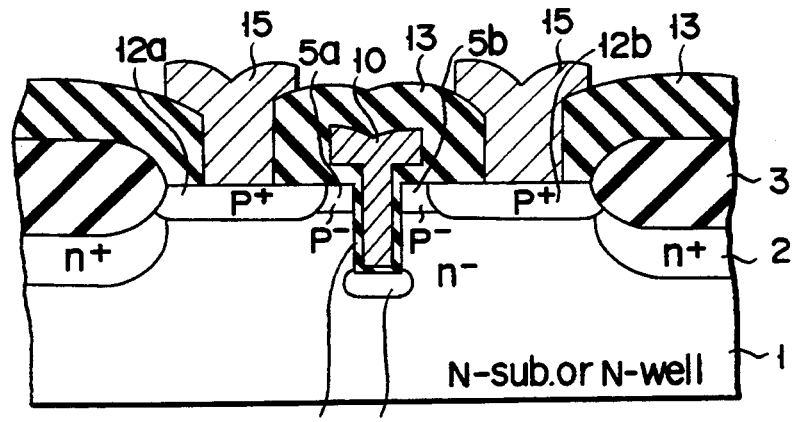
Figure 13C:
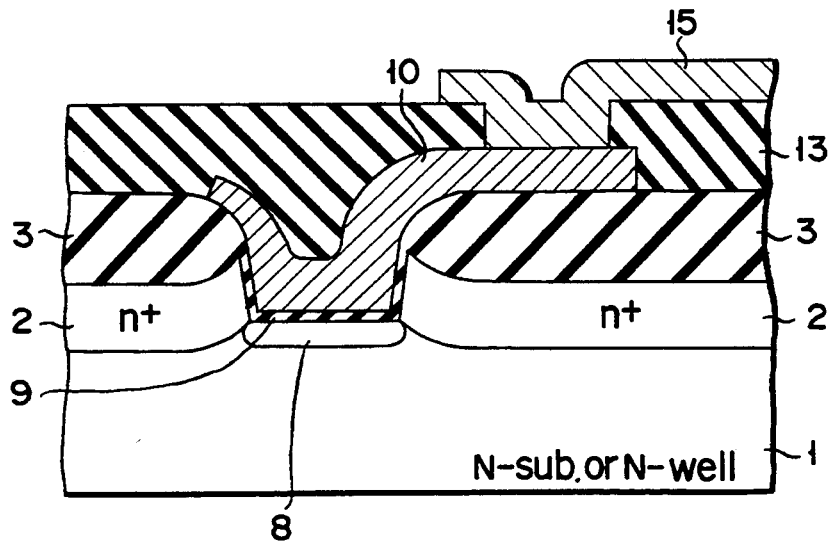
Figure 16A:
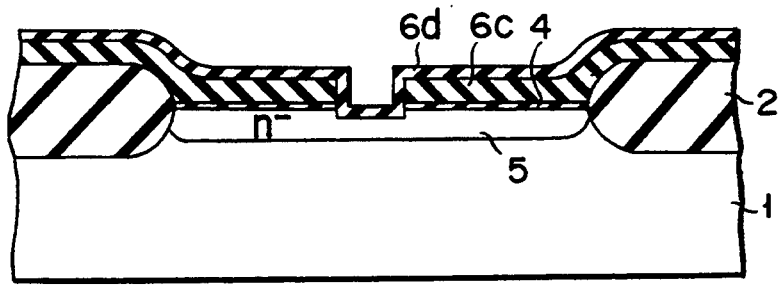
FIGS. 16A to 16D are sectional views showing the steps in manufacturing a MOSFET according to yet another embodiment of the present invention.
Figure 16B:
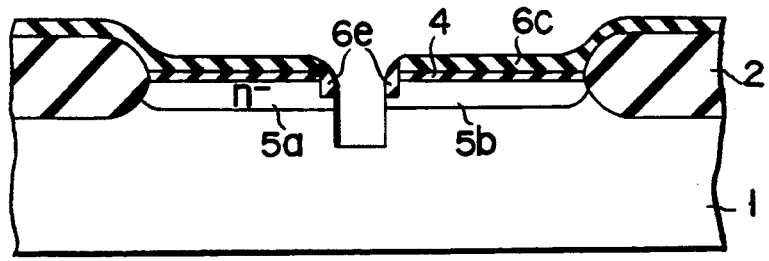
Figure 16C:
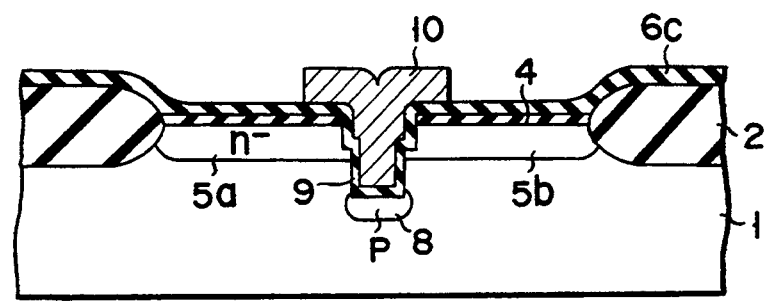
Figure 16D:
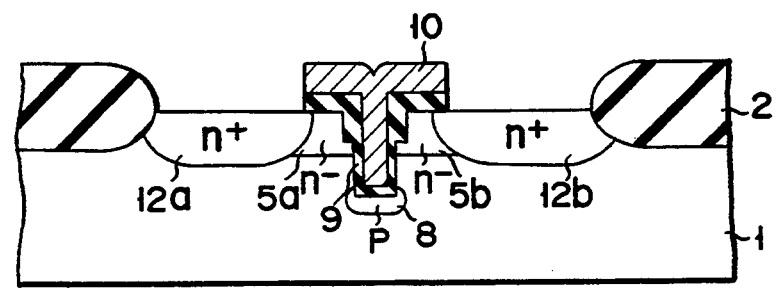

Although only the n-channel MOSFET has been described in the above embodiments, a p-channel MOSFET can be formed in the same manner as in the above embodiments by changing the conductivity types of the impurity and the substrate. The p-channel MOSFET is shown in FIGS. 13A to 13C.

Still other embodiments of the present invention are shown in FIGS. 14A to 14C, and FIGS. 15A to 15C.

FIGS. 14A to 14C show an embodiment wherein an upper end portion of a gate electrode does not appear above a substrate, but is buried in a groove. Therefore, a difference in level is decreased to improve flatness, thus achieving easy processing of any upper layer. As shown in FIG. 14C, an element isolation film is also etched to form a shallow groove when the groove for gate electrode is formed, and a gate electrode 10 is buried in the shallow groove formed in the element isolation film. As shown in the manufacturing steps in FIGS. 15A to 15D, a groove is formed in a thermal oxide film 4, a CVD Si₃N₄ film 6a, and a CVD SiO₂ film 6b by photolithography. At this time, an element isolation insulating film in a gate electrode extention portion is also etched (FIG. 15A). Thereafter, channel ions are implanted in the same manner as in FIGS. 2A to 2C to perform gate oxidation (FIG. 15B), thus depositing gate polysilicon. After an impurity is doped in the polysilicon layer, a resist (not shown) is applied. The entire surface is etched back, and the polysilicon layer is buried in the groove (FIG. 15C). Thereafter, the CVD SiO₂ film 6b, the Si₃N₄ film 6a, and the thermal oxide film 4 are subjected to RIE, and a CVD insulating film 19 is left on the side wall of the polysilicon layer 10. Then, n+-type impurity layers 12a and 12b are formed by ion implantation (FIG. 15D).

The groove is formed so as to leave a platform in the central portion of the gate contact portion. The groove is formed with a constant width so as to leave the flat polysilicon within. In an embodiment shown in FIGS. 16A to 16D, a groove is formed after a thermal oxide film 4 and a CVD SiO₂ film 6c are formed. In addition, a CVD SiO₂ film 6d is deposited and subjected to RIE to leave an SiO₂ film 6e on the side wall. Etching is further performed to increase the depth of the groove, and gate oxidation is performed while the side wall and the film are left. Although the various embodiments of the present invention have been described above, the present invention is not limited thereto.

Various modifications of the structure can be performed. For example, the p-type impurity region in the channel region need not be formed to extend only at a bottom portion of the groove, but may extend up to, e.g., an immediate level of the depth of the groove.

The p-type layer at the channel bottom portion is formed by ion implantation in the above embodiments. However, a p−-type epitaxial layer may be formed on a p-type substrate, and a gate groove may be formed to reach the p-type substrate or to have a greater depth. The n+-type layer may reach the side wall of the groove while the diffusion depth Xj of the n+-type layer is kept smaller than that of the n−-type layer.

Note that the impurity concentration of each region is not limited to the above-mentioned value. The impurity concentration of the p−-type semiconductor substrate (or well) may be selected within the range of $1 \times 10^{15}$ to $1 \times 10^{17}$ atoms/cm³; the p-type impurity layer of the channel, $1 \times 10^{16}$ to $5 \times 10^{17}$ atoms/cm³; the n−-type impurity layer of the source and drain regions, $1 \times 10^{18}$ to $1 \times 10^{20}$ atoms/cm³; and the n+-type impurity layer, $1 \times 10^{20}$ to $1 \times 10^{21}$ atoms/cm³.

Various changes or modifications may be made without departing from the spirit and scope of the present invention.

According to the present invention, the problems of the conventional MOSFET can be solved, and there is provided a highly reliable FET having an excellent drain breakdown voltage and current drive capacity.

What is claimed is:

1. A process for manufacturing a semiconductor device comprising the steps of forming a field insulating film on a semiconductor substrate of a first conductivity type, forming an impurity region of a second conductivity type in a surface region of said semiconductor substrate isolated by said field insulating film, forming a groove which extends through said impurity region, doping an impurity of said first conductivity type in the bottom portion of said groove separated from said impurity region of a second conductivity type to an impurity concentration higher than that of said substrate, forming a gate insulating film on the inner surface of said groove, forming a gate electrode by burying a conductive material in said groove, and doping an impurity of the second conductivity type in regions, spaced apart from said gate electrode, of said impurity region to form source and drain regions, said source and drain regions having a higher impurity concentration than that of said impurity region.

2. A process according to claim 1, wherein doping of the impurity of the second conductivity type in the regions, spaced apart from said gate electrode, of said impurity region is performed using said gate electrode, which extends on a surface of said impurity region, as a mask.

3. A process according to claim 1, wherein doping of the impurity of the second conductivity type to the regions, spaced apart from said gate electrode, of said impurity region is performed using insulating layers formed on the side walls of an upper portion of said gate electrode as a mask.

4. A process according to claim 1, wherein forming of the groove comprises etching the semiconductor substrate using a $SiO_2$ layer as a mask.

5. A process according to claim 1, wherein forming of the groove comprises etching the semiconductor substrate using an $Si_3N_4$ layer and an $SiO_2$ layer as a mask.

6. A process according to claim 1, wherein doping of the impurity of the second conductivity type to the regions, spaced apart from said gate electrode, of said impurity region comprises forming a polycrystalline silicon layer on an entire surface of the substrate, doping the impurity of the second conductivity type in said polycrystalline silicon layer, and thermally diffusing the impurity from said polycrystalline silicon layer in said semiconductor substrate.

7. A process according to claim 1, wherein said field insulating film is formed by selectively oxidizing the semiconductor substrate.

8. A process according to claim 1, wherein said field insulating film is formed by burying an insulating material in a groove formed in the substrate.

9. A process according to claim 1, wherein said doping of the impurity of the second conductivity type is carried out so that a junction depth of said impurity region is substantially equal to junction depths of said source and drain regions.

10. A process according to claim 1, wherein said doping of the impurity of said second conductivity type is carried out so that a junction depth of said impurity region is larger than junction depths of said source and drain regions.

11. A process according to claim 1, wherein the impurity concentration of said substrate is in the range of $1 \times 10^{15}$ to $1 \times 10^{17}$ atoms/cm$^3$.

12. A process according to claim 1, wherein an impurity concentration of a semiconductor region formed in the bottom portion of said groove is in the range of $1 \times 10^{15}$ to $1 \times 10^{17}$ atoms/cm$^3$.

13. A process according to claim 1, wherein an impurity concentration of said impurity region is in the range of $1 \times 10^{18}$ to $1 \times 10^{20}$ atoms/cm$^3$.

14. A process according to claim 1, wherein an impurity concentration of said source and drain region is in the range of $1 \times 10^{20}$ to $1 \times 10^{21}$ atoms/cm$^3$.

15. A process for manufacturing a semiconductor device, comprising:
 forming a field insulating film on a semiconductor substrate of a first conductivity type;
 forming a first impurity region of a second conductivity type in a surface region of said semiconductor substrate isolated by said field insulating film;
 forming a groove extending through said first impurity region;
 forming a second impurity region of said first conductivity type in a bottom portion of said groove separated from said first impurity region and having an impurity concentration higher than that of said substrate;
 forming a gate insulating film on an inner surface of said groove;
 forming a gate electrode by burying a conductive material in said groove; and
 doping an impurity of said second conductivity type in regions, spaced apart from said gate insulating film, of said first impurity region to form source and drain regions, said source and drain regions having a higher impurity concentration than that of said first impurity region.

16. A process according to claim 15, wherein said step of doping an impurity of the second conductivity type in regions, spaced apart from said gate electrode, comprises forming a third impurity region having a higher doping concentration than said first impurity region and separated from said gate insulating film by a portion of said first impurity region.

17. A process according to claim 15, wherein said step of doping an impurity region of the second conductivity type in regions, spaced apart from said gate electrode is performed subsequent to said step of forming said gate electrode.

18. A process according to claim 15, wherein:
 the impurity concentration of said substrate is in the range of $1 \times 10^{15}$ to $1 \times 10^{17}$ atoms/cm$^3$;
 an impurity concentration of a semiconductor region formed in the bottom portion of said groove is in the range of $1 \times 10^{15}$ to $1 \times 10^{17}$ atoms/cm$^3$;
 an impurity concentration of said first impurity region is in the range of $1 \times 10^{18}$ to $1 \times 10^{20}$ atoms/cm$^3$; and
 an impurity concentration of said source and drain region is in the range of $1 \times 10^{20}$ to $1 \times 10^{21}$ atoms/cm$^3$.

19. A process according to claim 15, wherein said steps of forming said first impurity region, forming said groove, and forming said gate insulating film comprise forming said groove after forming said first impurity region such that said first impurity region extends only along a sidewall portion of said groove.

20. A process according to claim 1, wherein:
 an impurity concentration of said substrate is in the range of $1 \times 10^{15}$ to $1 \times 10^{17}$ atoms/cm$^3$;
 an impurity concentration of a semiconductor region formed in the bottom portion of said groove is in the range of $1 \times 10^{15}$ to $1 \times 10^{17}$ atoms/cm$^3$;
 an impurity concentration of said impurity region is in the range of $1 \times 10^{18}$ to $1 \times 10^{20}$ atoms/cm$^3$; and
 an impurity concentration of said source and drain region is in the range of $1 \times 10^{20}$ to $1 \times 10^{21}$ atoms/cm$^3$.

21. A process according to claim 1, comprising doping an impurity of said first conductivity type in the bottom portion of said groove separated from said impurity region of a second conductivity type by a portion of said semiconductor substrate.

22. A process according to claim 15, comprising forming said second impurity region of said first conductivity type in said bottom portion of said groove separated from said first impurity region by a portion of said semiconductor substrate.

* * * * *